United States Patent [19]
Dempsey et al.

[11] Patent Number: 5,969,657
[45] Date of Patent: Oct. 19, 1999

[54] DIGITAL TO ANALOG CONVERTER

[75] Inventors: Dennis Dempsey; Christopher Gorman, both of Limerick, Ireland

[73] Assignee: Analog Devices, Inc., Norwood, Mass.

[21] Appl. No.: 08/898,677

[22] Filed: Jul. 22, 1997

[51] Int. Cl.$^6$ ................................................ H03M 1/68
[52] U.S. Cl. ........................................ 341/145; 341/154
[58] Field of Search ..................................... 341/145, 154

[56] References Cited

U.S. PATENT DOCUMENTS

| | | | |
|---|---|---|---|
| 3,997,892 | 12/1976 | Susset | 340/347 |
| 4,338,591 | 7/1982 | Tuthill | 340/347 |
| 4,491,825 | 1/1985 | Tuthill | 340/347 |
| 4,543,560 | 9/1985 | Holloway | 340/347 |
| 4,558,242 | 12/1985 | Tuthill et al. | 307/577 |
| 4,638,303 | 1/1987 | Masuda et al. | 341/154 |
| 4,918,448 | 4/1990 | Hauviller et al. | 341/145 |
| 5,495,245 | 2/1996 | Ashe | 341/145 |
| 5,604,501 | 2/1997 | McPartland | 341/144 |
| 5,703,588 | 12/1997 | Rivoir et al. | 341/145 |

OTHER PUBLICATIONS

Telmos Document—undated.

*Primary Examiner*—Howard L. Williams
*Attorney, Agent, or Firm*—Fish & Richardson P.C.

[57] ABSTRACT

A digital to analog converter having a pair of resistor strings. A first one of the resistor strings is adapted for coupling across a voltage supply. Resistors in the first resistor string produce voltages in response to current fed thereto from the voltage supply. A first switching network couples a voltage produced across a selected one of resistors in the first string across the second resistor string. The resistors in the second resistor string produce voltages in response to current passing from the first resistor string to the second resistor string through the first switching network. That is, the second resistor string is unbuffered from the first resistor string. A second switching network couples a selected one of the voltages produced at a selected one of the resistors in the second resistor string to an output. The resistance across the second resistor string is larger than the resistance of the selected one of the resistors in the first resistor string thereby reducing the loading effect of the second resistor string without requiring buffer amplifiers between the pair of resistor strings. In a preferred embodiment of the invention the resistances of the second mentioned string and the switching networks are selected to produce a step change of substantially one LSB, where LSB is the least significant bit of a digital word converted by the converter.

9 Claims, 11 Drawing Sheets

| $I_4 I_3 I_2 I_1$ | CLOSED SWITCHES | OPENED SWITCHES |
|---|---|---|
| 0000 | $SM_0, SM_1, SL_0$ | $SM_2, SM_3, SM_4, SL_1, SL_2, SL_3$ |
| 0001 | $SM_0, SM_1, SL_1$ | $SM_2, SM_3, SM_4, SL_0, SL_2, SL_3$ |
| 0010 | $SM_0, SM_1, SL_2$ | $SM_2, SM_3, SM_4, SL_0, SL_1, SL_3$ |
| 0011 | $SM_0, SM_1, SL_3$ | $SM_2, SM_3, SM_4, SL_0, SL_1, SL_2$ |
| 0100 | $SM_1, SM_2, SL_3$ | $SM_0, SM_3, SM_4, SL_0, SL_1, SL_2$ |
| 0101 | $SM_1, SM_2, SL_2$ | $SM_0, SM_3, SM_4, SL_0, SL_1, SL_3$ |
| 0110 | $SM_1, SM_2, SL_1$ | $SM_0, SM_3, SM_4, SL_0, SL_2, SL_3$ |
| 0111 | $SM_1, SM_2, SL_0$ | $SM_0, SM_3, SM_4, S_1, SL_2, SL_3$ |
| 1000 | $SM_2, SM_3, SL_0$ | $SM_0, SM_1, SM_4, S_1, SL_2, SL_3$ |
| 1001 | $SM_2, SM_3, SL_1$ | $SM_0, SM_1, SM_4, S_0, SL_2, SL_3$ |
| 1010 | $SM_2, SM_3, SL_2$ | $SM_0, SM_1, SM_4, S_0, SL_1, SL_3$ |
| 1011 | $SM_2, SM_3, SL_3$ | $SM_0, SM_1, SM_4, S_0, SL_1, SL_2$ |
| 1100 | $SM_3, SM_4, SL_3$ | $SM_0, SM_2, SM_2, S_0, SL_1, SL_2$ |
| 1101 | $SM_3, SM_4, SL_2$ | $SM_0, SM_2, SM_2, S_0, SL_1, SL_3$ |
| 1110 | $SM_3, SM_4, SL_1$ | $SM_0, SM_2, SM_2, S_0, SL_2, SL_3$ |
| 1111 | $SM_3, SM_4, SL_1$ | $SM_0, SM_2, SM_2, S_0, SL_2, SL_3$ |

| $I_2$ | $I_1$ | CLOSED SWITCHES | OPEN SWITCHES | CLOSED SWITCHES | OPEN SWITCHES | $V_O$ AT TERMINAL |
|---|---|---|---|---|---|---|
| 0 | 0 | $SM_0$, $SM_1$ | $SM_2$, $SM_3$, $SM_4$, | $SL_0$ | $SL_1$, $SL_2$, $SL_3$ | 0 |
| 0 | 1 | $SM_0$, $SM_1$ | $SM_2$, $SM_3$, $SM_4$, | $SL_1$ | $SL_0$, $SL_2$, $SL_3$ | 10/15 |
| 1 | 0 | $SM_0$, $SM_1$ | $SM_2$, $SM_3$, $SM_4$, | $SL_2$ | $SL_0$, $SL_1$, $SL_2$ | 20/15 |
| 1 | 1 | $SM_0$, $SM_1$ | $SM_2$, $SM_3$, $SM_4$, | $SL_3$ | $SL_0$, $SL_1$, $SL_2$ | 30/15 |

| CLOSED SWITCHES | OPEN SWITCHES | CLOSED SWITCHES | OPEN SWITCHES | $V_O$ | $I_2$ |
|---|---|---|---|---|---|
| $SM_1, SM_2$ | $SM_0, SM_3, SM_4,$ | $SL_3$ | $SL_0, SL_1, SL_2$ | $4v/15$ | 0 |
| $SM_1, SM_2$ | $SM_0, SM_3, SM_4,$ | $SL_2$ | $SL_0, SL_1, SL_3$ | $5v/15$ | 0 |
| $SM_1, SM_2$ | $SM_0, SM_3, SM_4,$ | $SL_1$ | $SL_0, SL_2, SL_3$ | $6v/15$ | 1 |
| $SM_1, SM_2$ | $SM_0, SM_3, SM_4,$ | $SL_0$ | $SL_0, SL_1, SL_2$ | $7v/15$ | 1 |

| $I_2$ | $I_1$ | CLOSED SWITCHES | OPEN SWITCHES | CLOSED SWITCHES | OPEN SWITCHES | $V_O$ AT TERMINAL |
|---|---|---|---|---|---|---|
| 0 | 0 | $SM_2, SM_3$ | $SM_0, SM_1, SM_4,$ | $SL_0$ | $SL_1, SL_2, SL_3$ | 8v/15 |
| 0 | 1 | $SM_2, SM_3$ | $SM_0, SM_1, SM_4,$ | $SL_1$ | $SL_0, SL_1, SL_2$ | 9v/15 |
| 1 | 0 | $SM_2, SM_3$ | $SM_0, SM_1, SM_4,$ | $SL_2$ | $SL_0, SL_1, SL_3$ | 10v/15 |
| 1 | 1 | $SM_2, SM_3$ | $SM_0, SM_1, SM_4,$ | $SL_3$ | $SL_0, SL_1, SL_2$ | 11v/15 |

| $I_{12}$ | $I_{11}$ | $I_{10}$ | $I_9$ | $I_8$ | $I_7$ | MSB CLOSED SWITCHES | OPEN SWITCHES |
|---|---|---|---|---|---|---|---|
| 0 | 0 | 0 | 0 | 0 | 0 | $SM'_0, SM'_1$ | $SM'_2, ... SM'_{64}$ |
| 0 | 0 | 0 | 0 | 0 | 1 | $SM'_1, SM'_2$ | $SM'_0, SM'_3, ... SM'_{64}$ |
| 0 | 0 | 0 | 0 | 1 | 0 | $SM'_2, SM'_3$ | $SM'_0, SM'_1, SM'_4, ... SM'_{64}$ |
| 0 | 0 | 0 | 0 | 1 | 1 | $SM'_3, SM'_4$ | $SM'_0, SM'_1, SM'_2, SM'_5, ... SM'_{64}$ |
| | | | | | | | |
| 1 | 1 | 1 | 0 | 0 | 1 | $SM'_{61}, SM'_{62}$ | $SM'_0, ... SM'_{60}, SM'_{63}, SM'_{64}$ |
| 1 | 1 | 1 | 1 | 1 | 0 | $SM'_{62}, SM'_{63}$ | $SM'_0, ... SM'_{61}, SM'_{64}$ |
| 1 | 1 | 1 | 1 | 1 | 1 | $SM'_{63}, SM'_{64}$ | $SM'_0, ... SM'_{62}$ |

FIG. 8

| | $I_7$ | $I_6$ | $I_5$ | $I_4$ | $I_3$ | $I_2$ | $I_1$ | LSB CLOSED SWITCHES |
|---|---|---|---|---|---|---|---|---|
| $I_7=0$ { | 0 | 0 | 0 | 0 | 0 | 0 | 0 | $SL'_0$ |
| | 0 | 0 | 0 | 0 | 0 | 0 | 1 | $SL'_1$ |
| | 0 | 0 | 0 | 0 | 0 | 1 | 0 | $SL'_2$ |
| | 0 | 0 | 0 | 0 | 1 | 1 | 1 | $SL'_3$ |
| | ⋮ | ⋮ | ⋮ | ⋮ | ⋮ | ⋮ | ⋮ | ⋮ |
| | 0 | 1 | 1 | 1 | 1 | 1 | 1 | $SL'_{63}$ |
| $I_7=1$ { | 1 | 0 | 0 | 0 | 0 | 0 | 0 | $SL'_{63}$ |
| | 1 | 0 | 0 | 0 | 0 | 0 | 1 | $SL'_{62}$ |
| | ⋮ | ⋮ | ⋮ | ⋮ | ⋮ | ⋮ | ⋮ | ⋮ |
| | 1 | 1 | 1 | 1 | 1 | 1 | 1 | $SL'_0$ |
| $I_7=1$ { | 0 | 0 | 0 | 0 | 0 | 0 | 0 | $SL'_0$ |
| | 0 | 0 | 0 | 0 | 0 | 0 | 1 | $SL'_1$ |
| | ⋮ | ⋮ | ⋮ | ⋮ | ⋮ | ⋮ | ⋮ | ⋮ |

FIG. 9

DIGITAL TO ANALOG CONVERTER

BACKGROUND OF THE INVENTION

This invention relates generally to digital to analog converters (DACs) and more particularly to resistor string type DACs adapted for integrated circuit fabrication.

As is known in the art, DACs have been used in a wide variety of applications to convert an N-bit digital word into a corresponding analog signal. One such DAC includes a string of $2^N$ resistors having substantially the same resistance serially connected across a reference voltage. Thus, the resistor string divides the reference voltage among the resistors in the string. A switching network is provided for coupling the voltage at one of the resistors to an output to produce the converted voltage. While such DAC is suitable for applications where N is relatively small, when N is large, for example, where N is in the order of twelve, 4,096 resistors, 4,096 switches, and 4,096 control lines are required thereby resulting in a relatively large number of elements to be fabricated on an integrated circuit chip.

One technique suggested to reduce the number of elements is to use a segmented converter. In a segmented converter, a first stage uses a resistor string for converting a group of higher order bits of the N-bit digital word and a second stage decodes the remaining, lower order bits. A non-linear converter of that general type is shown in an article by Gryzbowski et al., entitled "Non-liner Functions from D/A Converters", Electronic Engineering 1971, pgs. 48–51. The converter disclosed in that article is designed for operation with relay switching and is not readily adapted to modern semiconductor technology. Another segmented converter is described in U.S. Pat. No. 3,997,892, issued December 1976, inventor Susset. The segmented converter described in U.S. Pat. No. 4,543,560 includes a resistor string for both the first and second stages with buffer amplifiers between the stages to prevent the second stage resistor string from loading the first resistor string.

Still another type of segmented converters is described in U.S. Pat. No. 4,338,591 issued Jul. 6, 1982, inventor Michael G. Tuthill, assigned to the same assignee as the present invention. Here, a resistor string is used for the first stage, an R-2R DAC is used for the second stage and buffer amplifiers are used between the first and second stages to reduce the effect of loading by the second stage on the first stage. The voltage produced across a selected one of the resistors in the first resistor string is fed across the second resistor string through the buffer amplifiers.

A third type of segmented DAC is described in U.S. Pat. No. 5,495,245, issued Feb. 27, 1996, inventor James J. Ashe, assigned to the same assignee as the present invention. The DAC described therein includes a pair of first stage resistor strings coupled to a second resistor string through a first switching network. A pair of reference voltages are coupled to the pair of resistor strings. The first switching network operates such that a voltage produced at a selected one of the resistors in one of the pair of first stage resistor strings and a voltage produced at a selected one of the resistors in the other one of the pair of first resistor strings are coupled across the second stage resistor string. A second switching network couples an output at a selected one of the resistors in the second resistor string to an output of the DAC. Buffer amplifiers are not included between the pair of first stage resistor strings and the second stage resistor string. Two arrangements are described. In one arrangement, the first switching network responds to the MSBs and the second switching network responds to the LSBs. In the other arrangement, the first switching network responds to the LSBs and the second switching network responds to the MSBs. In former arrangement, each resistor in the pair of resistor strings has a value $2^N R$, where R is the resistance of each of the $2^{N/2}$ resistors in the second resistor string. In the latter arrangement, each resistor in the second resistor string has a value $2^{N/2} R$, where R is the resistance of each resistor in the pair of first resistor strings. In both arrangements, the entire current passing between the pair of reference voltages passes through the resistors. Therefore, while such arrangements are useful in many applications the relatively high number of resistors which are required in both the first and second pairs of resistor strings thereby requiring relative large chip surface area for their fabrication.

SUMMARY OF THE INVENTION

In accordance with the invention a digital to analog converter is provided having a pair of resistor strings. A first one of the resistor strings is adapted for coupling across a voltage supply. The resistors in the first resistor string produce voltages in response to current fed thereto from the voltage supply. The second string of resistors has a plurality of, only m, resistors of substantially equal resistance serially coupled between a pair of second resistor string input terminals, where m is an odd integer. A first switching network has a pair of switch output terminals connected to the second resistor string input terminals. The first switching network is adapted to couple terminals of a selected one of the resistors in the first string to the pair of switch output terminals. The resistors in the second resistor string produce voltages in response to current passing between the first resistor string and the second resistor string through the first switching network. A second switching network is adapted to couple a selected one of the voltages produced at a terminal of a selected one of the resistors in the second resistor string to an output of the converter. The resistance across the second resistor string is larger than the resistance of the selected one of the resistors in the first resistor string.

In a preferred embodiment of the invention the resistances of the second mentioned string and resistance of the first switching network, are selected to produce a step change of substantially one LSB at the converter output, where LSB is the least significant bit of a digital word converted by the converter, when the first switching network switches from coupling one of the selected first resistors to the pair of output terminals to coupling the one of the first resistors successively serially coupled to the selected first resistors to the output terminals thereof.

BRIEF DESCRIPTION OF THE DRAWING

Other features of the invention, as well as the invention itself, will become more readily apparent with reference to the following detailed description taken together with the following drawings, in which:

FIG. 2 is a table showing the relationship between the four bit digital words fed to the DAC of FIG. 1 and open/closed positions of switches used in such DAC;

FIG. 8 is a table showing the relationship between the six most significant bits of the twelve bit digital words fed to the DAC of FIG. 7 and open/closed positions of switches used in such DAC;

FIG. 9 is a table showing the relationship between the seven least significant bits of the twelve bit digital words fed to the DAC of FIG. 7 and open/closed positions of switches used in such DAC;

DESCRIPTION OF THE PREFERRED EMBODIMENTS

Figure 1:
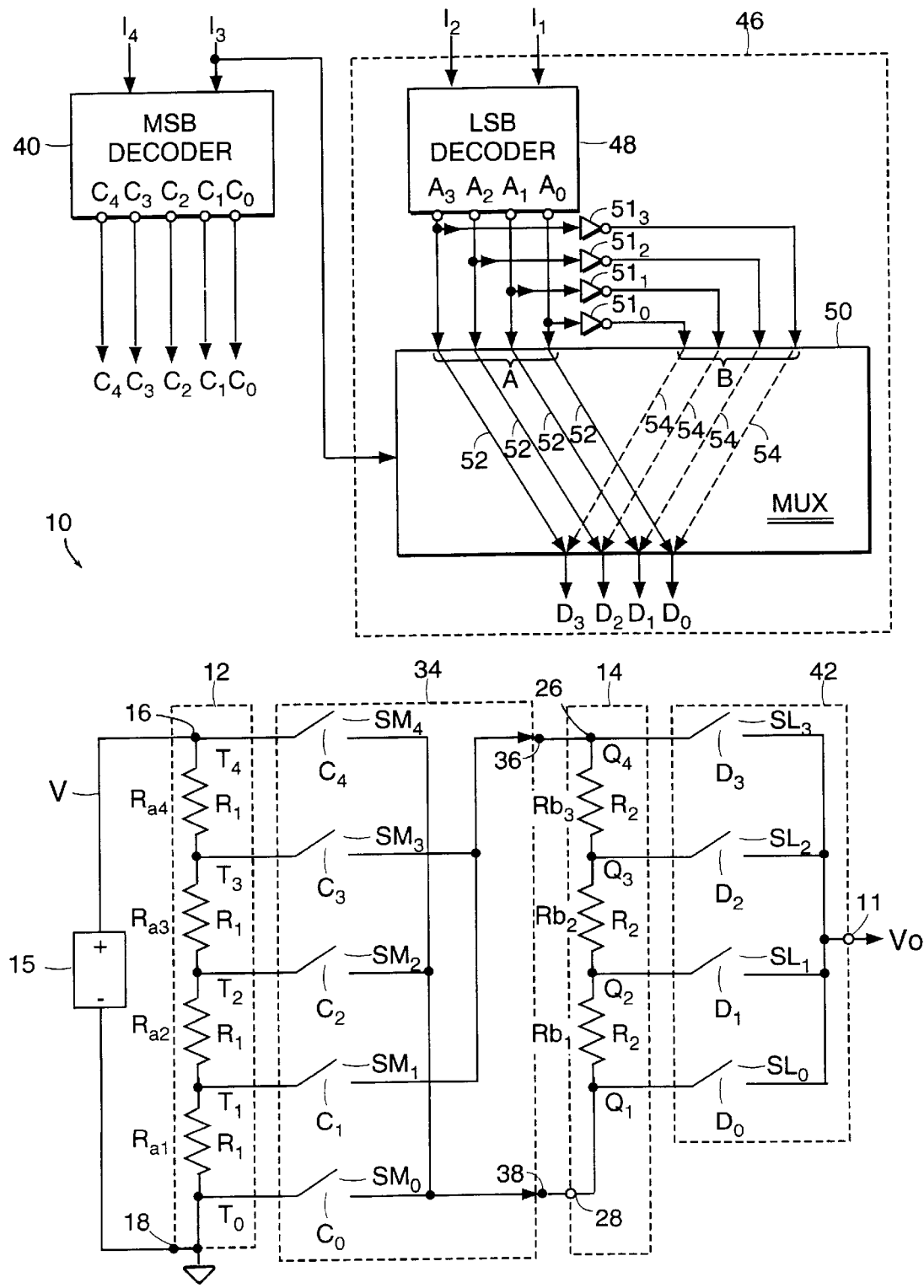
FIG. 1 is a schematic diagram of a four bit digital to analog converter (DAC) according to the invention.

Referring now to FIG. 1, a DAC 10 is shown to adapted to convert an N bit, here N=4, digital word, $I_4I_3I_2I_1$, (where bit $I_1$ is the least significant bit (LSB) and $I_4$ is the most significant bit (MSB)) into a corresponding analog signal, $V_o$, at output terminal 11. The DAC 10 includes a pair of resistor strings 12, 14. Resistor string 12 is adapted for coupling across a voltage supply 15. The voltage supply 15 produces a voltage, +V, at terminal 16 relative to ground potential at terminal 18. The first resistor string has a plurality of, here $2^{N/2}$, (i.e., 4) resistors Ra1–Ra4, serially connected between terminals 16 and 18, as shown. The resistance of each one of the resistors Ra1–Ra4 is here $R_1$ ohms. It is noted that resistors Ra1, Ra2, Ra3 and Ra4 have: resistor ra1 terminals $T_0$, $T_1$; resistor ra2 terminal $T_1$, $T_2$; resistor Ra3 terminals $T_2$ and $T_3$; and, resistor Ra4 terminals $T_3$ and $T_4$, respectively, as shown. Resistor Ra4 terminal $T_4$ is connected to terminal 16 and resistor Ra1 terminal $T_0$ is connected to input terminal 18, as shown. The resistors Ra1–Ra4 in the resistor string 12 produce voltages at the terminals $T_1$–$T_3$ in response to current fed thereto from the voltage supply 15.

The second resistor string 14 has a plurality of, only $2^{N/2}-1$, here three resistors Rb1, Rb2, and Rb3 of substantially equal resistance, here a resistance of $R_2$ ohms, serially coupled between a pair of second resistor string 14 input terminals 26, 28, as shown. (It is noted that $2^{N/2}-1$) is an odd integer.) Resistors Rb1, Rb2 and Rb3 have: resistor Rb1 terminals Q1, Q2, resistor Rb2 has resistor terminals Q2, Q3, and resistor Rb3 has resistor terminals Q3, Q4, respectively, as shown. Terminal $Q_1$ is connected to input terminal 28 and terminal $Q_4$ is connected to input terminal 26.

A first switching network 34 has a pair of switch output terminals 36, 38 connected to the second resistor string 14 input terminals 26, 28, respectively, as shown. The first switching network 34 includes a plurality of, here $2^{N/2}+1$, here five, switches $SM_0$, $SM_1$, $SM_2$, $SM_3$ and $SM_4$. The inputs of switches $SM_0$, $SM_1$, $SM_2$, $SM_3$ and $SM_4$ are connected to terminals $T_0$, $T_1$, $T_2$, $T_3$ and $T_4$, respectively, as shown. The outputs of switches $SM_0$, $SM_2$, and $SM_4$ are connected switch output terminal 38, as shown. The outputs of switches $SM_1$ and $SM_3$ are connected to switch output terminal 36, as shown. The "on" (i.e., closed)/"off" (i.e., open) condition of the switches $SM_0$, $SM_1$, $SM_2$, $SM_3$ and $SM_4$ is controlled by binary (i.e., logic) signals on control lines $C_0$, $C_1$, $C_2$, $C_3$ and $C_4$, respectively, as indicated. The binary signals on control lines $C_0$, $C_1$, $C_2$, $C_3$ and $C_4$, are produced by a Most Significant Bit (MSB) decoder section 40. The MSB decoder section 40 produces the binary signals on control lines $C_0$–$C_4$ in response to the two most significant bits, $I_4$, $I_3$ of the four bit digital word $I_4I_3I_2I_1$ being converted to an analog signal by DAC 10. The relationship between the bits on lines $I_4$ and $I_3$ and the open/closed condition of the switches $SM_0$, $SM_1$, $SM_2$, $SM_3$ is shown in FIG. 2. The MSB decoder section 40 here uses Gray code decoding.

A second switching network 42 has an output terminal 11 which provides the output, $V_o$, for the DAC 10 (i.e., the converted analog signal). The second switching network 42 includes a plurality of, $2^{N/2}$, here four, switches $SL_0$, $SL_1$, $SL_2$, and $SL_3$. The inputs of switches $SL_0$, $SL_1$, $SL_2$, and $SL_3$ are connected to terminals $Q_1$, $Q_2$, $Q_3$, and $Q_4$, respectively, as shown. The outputs of switches $SL_0$, $SL_1$, $SL_2$ and $SL_3$ are connected to DAC 10 output terminal 11, as shown. The "on" (i.e., closed)/"off" (i.e., open) condition of the switches $SL_0$, $SL_1$, $SL_2$, and $SL_3$ is controlled by binary (i.e., logic) signals on control lines $D_0$, $D_1$, $D_2$, and $D_3$, respectively, as indicated. The binary signals on control lines $D_0$, $D_1$, $D_2$, and $D_3$, are produced by a Least Significant Bit (LSB) decoder section 46. The LSB decoder section 46 includes an LSB decoder 48 and a multiplexer 50. The LSB decoder section 46 is fed by the two least significant bits $I_2$, $I_1$ and the digital word being converted by the DAC 10 and the next highest order bit, i.e., bit $I_3$ of such digital word.

More particularly, the LSB decoder 48 is fed by the two least significant bits $I_2$ and $I_1$ and, in response to such bits, produces binary signals at output terminals $A_0$, $A_1$, $A_2$ and $A_3$. The output terminals $A_0$, $A_1$, $A_2$ and $A_3$ are connected to two sets of inputs to the multiplexer 50 (i.e., set of inputs A and set of inputs B. The multiplexer 50 has output terminals $D_0$, $D_1$, $D_2$ and $D_3$. In response to the binary signal of bit $I_3$ one of the two input sets A or B is selectively coupled to the output terminals $D_0$, $D_1$, $D_2$ and $D_3$. More particularly, when the binary signal of bit $I_3$ is logic 0, the output terminals $A_0$, $A_1$, $A_2$ and $A_3$ become coupled to output terminals $D_0$, $D_1$, $D_2$ and $D_3$, respectively, as indicated by the solid lines 52 shown in multiplexer 50. When the binary signal of bit $I_3$ is logic 1, the output terminals $A_3$, $A_2$, $A_1$ and $A_0$ become coupled to output terminals $D_3$, $D_2$, $D_1$ and $D_0$, respectively, as indicated by the dotted lines 54 shown in multiplexer 50 after passing through inverters $51_3$, $51_2$, $51_1$, $51_0$, respectively, as shown. Thus, the LSB decoder section 46 produces the binary signals on control lines $D_0$–$D_3$ in response to the three least significant bits, $I_3$, $I_2$, $I_1$ of the four bit digital word $I_4I_3I_2I_1$ being converted in an analog signal by DAC 10. The relationship between the bits on lines $I_3$, $I_2$ and $I_1$ and the open/closed condition of the switches $SL_0$, $SL_1$, $SL_2$, $SL_3$ is shown in FIG. 2.

It is first noted that the first switching network 34 is adapted to couple terminals of a selected one of the resistors Ra1–Ra4 in the first resistor string 12 to the pair of switch output terminals 36, 38. The resistors Rb1–Rb4 in the second resistor 14 string produce voltages at the terminals $Q_1$–$Q_4$ in response to current passing between the first resistor string 12 and the second resistor string 14 through the first switching network 34. The second switching network 42 is adapted to couple a selected one of the voltages produced at a resistor terminal $Q_1$–$Q_4$ of a selected one of the resistors Rb1–Rb3 in the second resistor string 14 to the output terminal 11 of the converter 10.

Figure 3:
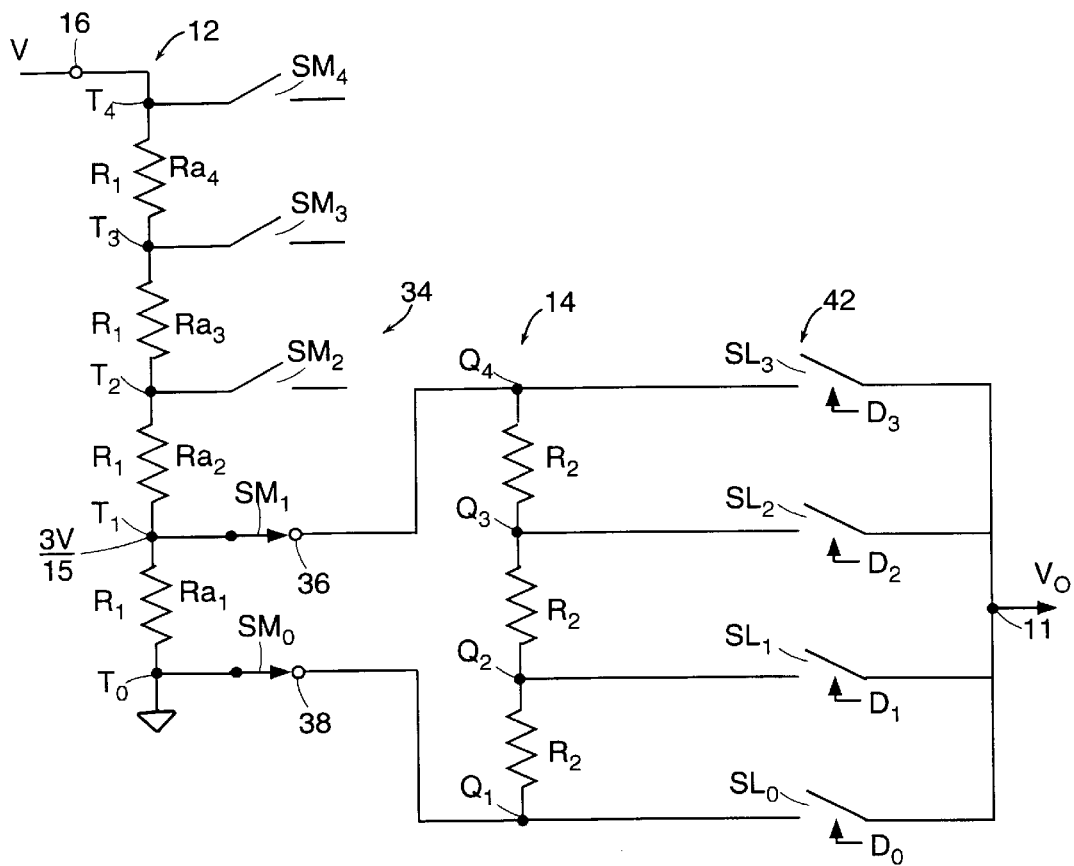
FIG. 3 is a schematic diagram of the DAC of FIG. 1 when such DAC is fed a digital word having its two most significant bits 00 and a table showing the relationship between the two least significant bits of such digital word and open/closed positions of switches used in such DAC.

In operation, consider as a first example, a condition where two most significant bits (i.e., $I_4I_3$) of the digital word, $I_4I_3I_2I_1$, fed to the decoder section 40 are 00. From FIG. 2, switches $SM_0$ and $SM_1$ are closed while switches $SM_2$, $SM_3$ and $SM_4$ are open, as shown in FIG. 3. Thus, the terminals $T_1$ and $T_0$ are coupled to terminals 36, 38, respectively, through switches $SM_1$, $SM_0$, respectively, as shown. In this example, the resistance $R_1$ equals the resistance $R_2$. Further, assume an ideal case where the resistance of each of the switches $SM_1$, $SM_0$ is zero. The resistance between terminals $T_0$ and $T_1$ is:

$$R_p = R_1[3R_2]/[R_1+3R_2].$$

Thus, if $R_1=R_2$, $R_p=3R_1/4$. The voltage at terminal $T_0$ is ground (i.e., zero volts). The voltage at terminal $T_1$ is:

$$V[R_p]/[3R_1+R_p].$$

Thus, if $R_1=R_2$, the voltage at terminal $T_1$ is 3 V/15.

To put it another way, the first resistor string 12 divides the voltage V among the $2^{N/2}$ (i.e., here four) resistors Ra1–Ra$2^{N/2}$ (i.e., here Ra1–Ra4) in combination with the loading effect of a second resistor string 14 and the resistance of the first switching network 12.

When the digital word $I_4I_3I_2I_1$ being converted is 0000 (i.e., bits $I_2$ and $I_1$ are also both logic 0), an output voltage $V_o$ is produced at output terminal 11 of 0 volts because switch $SL_0$ is closed (and all other switches $SL_1$, $SL_2$ and $SL_3$ are open). When the digital word $I_4I_3I_2I_1$ being converted is 0001 (i.e., bits $I_2$ is logic 0 and bit $I_1$ is logic 1) the output voltage $V_o$ produced at output terminal 11 is V/15 because: The voltage at terminal $T_D$ is zero; The voltage at terminal $T_A$ is 3 V/15; Switch $SL_1$ is closed; and all other switches $SL_0$, $SL_2$ and $SL_3$ are open. When the digital word $I_4I_3I_2I_1$ being converted is 0010 (i.e., bit $I_2$ is logic 1 and bit $I_1$ is logic 0), an output voltage $V_o$ is produced at output terminal 11 of 2[V/15] volts because switch $SL_0$ is closed (and all other switches $SL_1$, $SL_2$ and $SL_0$ are open). When the digital word $I_4I_3I_2I_1$ being converted is 0011 (i.e., bits $I_1$ and $I_2$ are both logic 1) the output voltage $V_o$ produced at output terminal 11 is 3[V/15] because switch $SL_3$ is closed (and all other switches $SL_0$, $SL_1$ and $SL_2$ are open).

Figure 4:
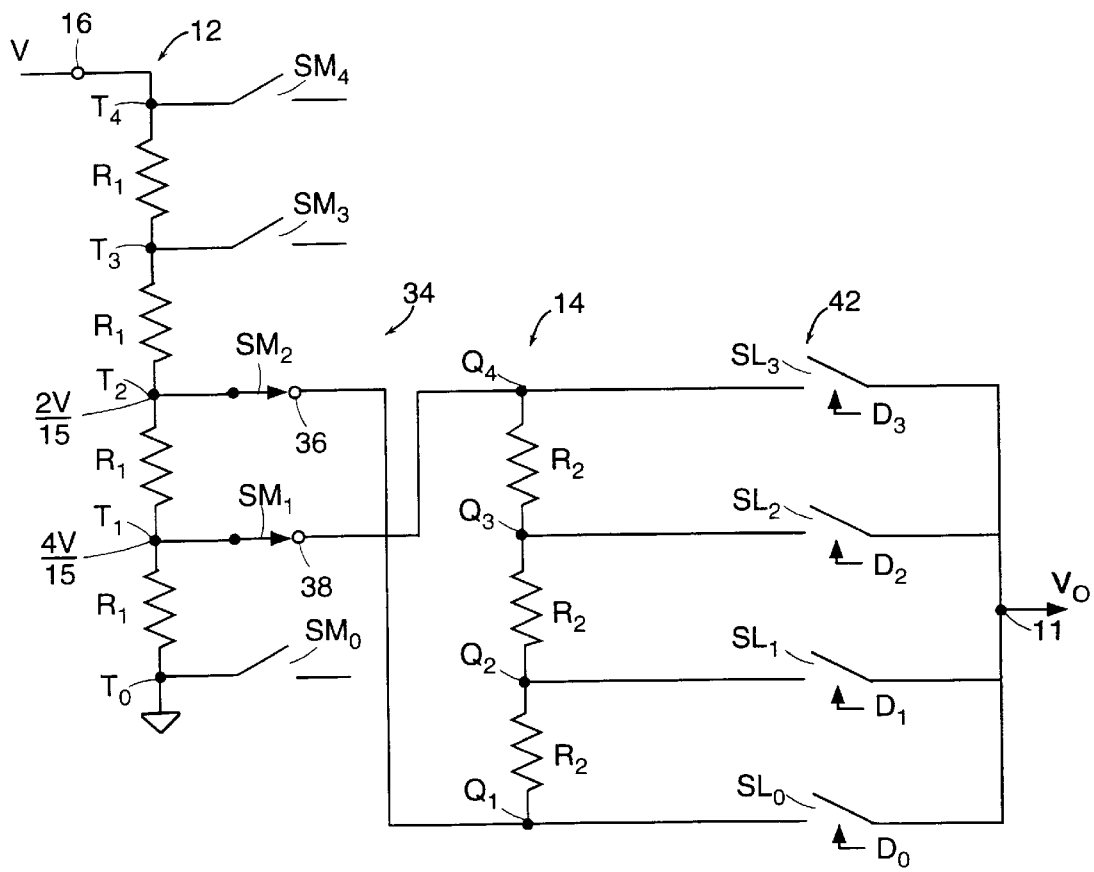
FIG. 4 is a schematic diagram of the DAC of FIG. 1 when such DAC is fed a digital word having it's two most significant bits 01 and a table showing the relationship between the two least significant bits of such digital word and open/closed positions of switches used in such DAC.

Considering now a condition where two most significant bits (i.e., $I_4I_3$) of the digital word, $I_4I_3I_2I_1$, fed to the decoder sections 40, 46 are 01 (i.e., $I_3=1$ and $I_4=0$). From FIG. 2, switches $SM_1$ and $SM_2$ are closed while switches $SM_0$, $SM_3$ and $SM_4$ are open, as shown in FIG. 4. Thus, the terminals $T_2$ and $T_1$ are connected to terminals 36, 38, respectively, through switches $SM_2$, $SM_1$, respectively, as shown. As noted above, here the resistance $R_1$ equals the resistance $R_2$. Further, again assuming an ideal case where the resistance of each of the switches $SM_2$, $SM_1$ is zero. The voltage at terminal $T_1$ will be 4 V/15 and the voltage at terminal $T_2$ will be 7 V/15. (It is noted that the voltage at terminal $T_1$ has changed a step of V/15 (i.e., one LSB) from the 3 V/15 volt condition at terminal $T_1$ in the configuration shown in FIG. 3 to now 4 V/15).

When the digital word $I_4I_3I_2I_1$ being converted is 0100 (i.e., bits $I_2$ and $I_1$ are also both logic 0), an output voltage $V_o$ is produced at output terminal 11 of 4[V/15] volts because switch $SL_3$ is closed (and all other switches $SL_0$, $SL_2$ and $SL_3$ are open). When the digital word $I_4I_3I_2I_1$ being converted is 0101 (i.e., bits $I_2$ is logic 0 and bit $I_1$ is logic 1) the output voltage $V_o$ produced at output terminal 11 is 5[V/15] because switch $SL_2$ is closed (and all other switches $SL_0$, $SL_1$ and $SL_3$ are open). When the digital word $I_4I_3I_2I_1$ being converted is 0110 (i.e., bit $I_2$ is logic 1 and bit $I_1$ is logic 0), an output voltage $V_o$ is produced at output terminal 11 of 6[V/15] volts because switch $SL_1$ is closed (and all other switches $SL_0$, $SL_2$ and $SL_3$ are open). When the digital word $I_4I_3I_2I_1$ being converted is 0111 (i.e., bits $I_1$ and $I_2$ are both logic 1) the output voltage $V_o$ produced at output terminal 11 is 7[V/15] because switch $SL_0$ is closed (and all other switches $SL_1$, $SL_2$ and $SL_3$ are open).

Figure 5:
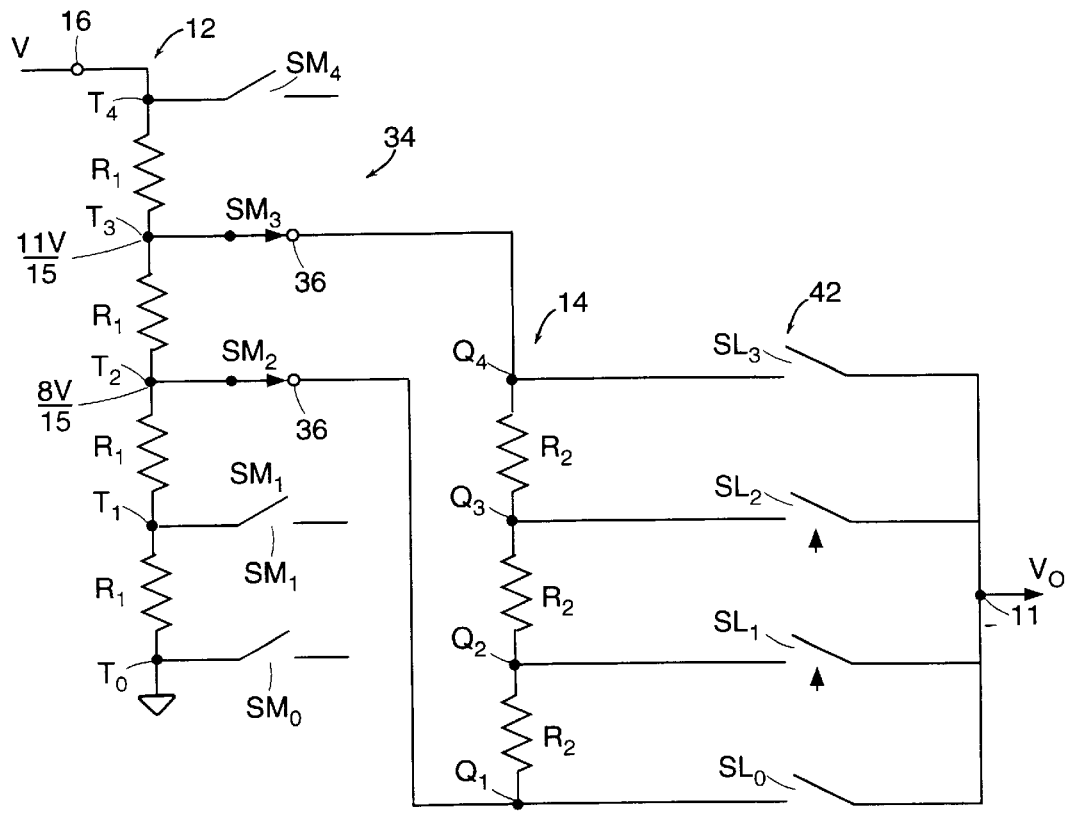
FIG. 5 is a schematic diagram of the DAC of FIG. 1 when such DAC is fed a digital word having its two most significant bits 10 and a table showing the relationship between the two least significant bits of such digital word and open/closed positions of switches used in such DAC.

When the two most significant bits (i.e., $I_4I_3$) of the digital word, $I_4I_3I_2I_1$, fed to the decoder section 40, 46 are 10 (i.e., $I_4=1$ and $I_3=0$). From FIG. 2, switches $SM_2$ and $SM_3$ are closed while switches $SM_0$, $SM_1$ and $SM_4$ are open, as shown in FIG. 5. Thus, the terminals $T_2$ and $T_3$ are connected to terminals 38, 36, respectively, through closed switches $SM_2$, $SM_3$, respectively, as shown. Assume an ideal case where the resistance of each of the switches $SM_2$, $SM_3$ is zero. The voltage at terminal $T_2$ will be 8 V/15 and the voltage at terminal $T_3$ will be 11 V/15. (It is noted that the voltage at terminal $T_2$ has changed a step of V/15 (i.e., one LSB) from the 7 V/15 volt condition at terminal $T_2$ in the configuration shown in FIG. 4 to the 8 V/15 condition in FIG. 5).

When the digital word $I_4I_3I_2I_1$ being converted is 1000 (i.e., bits $I_2$ and $I_1$ are also both logic 0), an output voltage $V_o$ is produced at output terminal 11 of 8[V/15] volts because switch $SL_0$ is closed (and all other switches $SL_1$, $SL_2$ and $SL_3$ are open). When the digital word $I_4I_3I_2I_1$ being converted is 1001 (i.e., bits $I_2$ is logic 0 and bit $I_1$ is logic 1) the output voltage $V_o$ produced at output terminal 11 is 9[V/15] because switch $SL_1$ is closed (and all other switches $SL_0$, $SL_2$ and $SL_3$ are open). When the digital word $I_4I_3I_2I_1$ being converted is 1010 (i.e., bit $I_2$ is logic 1 and bit $I_1$ is logic 0), an output voltage $V_o$ is produced at output terminal 11 of 10[V/15] volts because switch $SL_2$ is closed (and all other switches $SL_0$, $SL_1$ and $SL_3$ are open). When the digital word $I_4I_3I_2I_1$ being converted is 1011 (i.e., bits $I_1$ and $I_2$ are both logic 1) the output voltage $V_o$ produced at output terminal 11 is 11[V/15] because switch $SL_3$ is closed (and all other switches $SL_0$, $SL_1$ and $SL_2$ are open).

Figure 6:
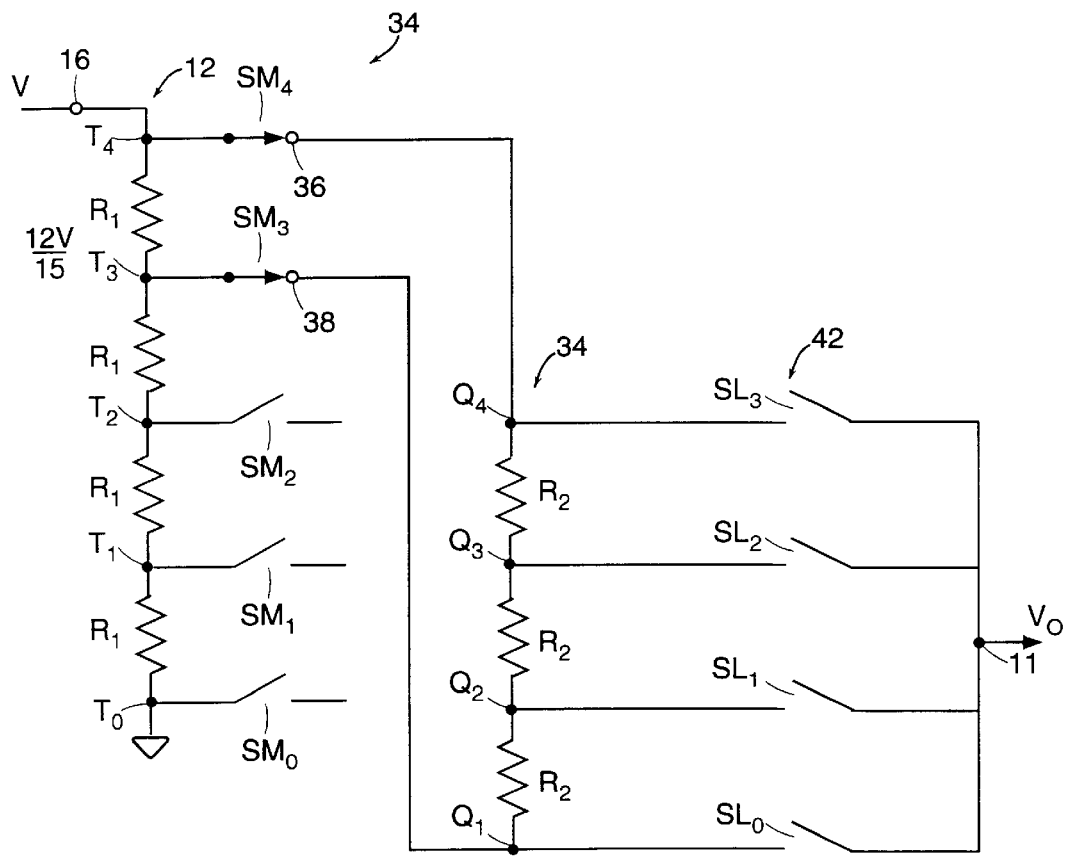
FIG. 6 is a schematic diagram of the DAC of FIG. 1 when such DAC is fed a digital word having its two most significant bits 11 and a table showing the relationship between the two least significant bits of such digital word and open/closed positions of switches used in such DAC.

When the two most significant bits (i.e., $I_4I_3$) of the digital word, $I_4I_3I_2I_1$ fed to the decoder section 40, 46 are 11. From FIG. 2, switches $SM_4$ and $SM_3$ are closed while switches $SM_0$, $SM_1$ and $SM_2$ are open, as shown in FIG. 6. Thus, the terminals $T_3$ and $T_4$ are connected to terminals 36, 38, respectively, through switches $SM_3$, $SM_4$, respectively, as shown. As noted above, here the resistance $R_1$ equals the resistance $R_2$. Further, again assume an ideal case where the resistance of each of the switches $SM_3$, $SM_4$ is zero. The voltage at terminal $T_3$ will be 12 V/15 and the voltage at terminal $T_4$ will be V. (It is noted that the voltage at terminal $T_3$ has changed a step of V/15 (i.e., one LSB) from the 11 V/15 volt condition at terminal $T_3$ in the configuration shown in FIG. 5 to the 12 V/15 condition in FIG. 5.

When the digital word $I_4I_3I_2I_1$ being converted is 1100 (i.e., bits $I_2$ and $I_1$ are also both logic 0), an output voltage $V_o$ is produced at output terminal 11 of 12[V/15] volts because switch $SL_3$ is closed (and all other switches $SL_0$, $SL_1$ and $SL_2$ are open). When the digital word $I_4I_3I_2I_1$ being converted is 1101 (i.e., bits $I_2$ is logic 0 and bit $I_1$ is logic 1) the output voltage $V_o$ produced at output terminal 11 is 13[V/15] because switch $SL_2$ is closed (and all other switches $SL_0$, $SL_1$ and $SL_3$ are open). When the digital word $I_4I_3I_2I_1$ being converted is 1110 (i.e., bit $I_2$ is logic 1 and bit $I_1$ is logic 0), an output voltage $V_o$ is produced at output terminal 11 of 14[V/15] volts because switch $SL_1$ is closed (and all other switches $SL_0$, $SL_2$ and $SL_3$ are open). When the digital word $I_4I_3I_2I_1$ being converted is 1111 (i.e., bits $I_2$ and $I_2$ are both logic 1) the output voltage $V_o$ produced at output terminal 11 is 15[V/15]=V because switch $SL_0$ is closed (and all other switches $SL_1$, $SL_2$ and $SL_3$ are open)

Thus, it is noted that when the N=4 bit digital word $I_4I_3I_2I_1$ changes (i.e., increases or decreases) by one least significant bit, the output voltage, $V_o$, at terminal 11 changes (i.e, increases or decreases) a step of one LSB (i.e., the output at terminal 11 changes $V/[2^N-1]=V/15$.

It is noted that if the desired range of the output voltage at terminal 11 is to be from zero to 15[V/16], an additional resistor (i.e., a gain setting resistor) of, in the example above, of $R_1/4$ is inserted serially between the terminal 16 and the terminal $T_4$ in FIG. 1. With such an additional resistor, the relationship between the bits of the input digital word $I_4I_3I_2I_1$ and the output voltage is as follows:

| $I_4I_3I_2I_1$ | Output Voltage, $V_0$ (volts) |
| --- | --- |
| 0000 | 0 |
| 0001 | V/16 |
| 0010 | 2 [V/16] |
| 0011 | 3 [V/16] |
| 0100 | 4 [V/16] |
| 0101 | 5 [V/16] |
| 0110 | 6 [V/16] |
| 0111 | 7 [V/16] |
| 1000 | 8 [V/16] |
| 1001 | 9 [V/16] |
| 1010 | 10 [V/16] |
| 1011 | 11 [V/16] |
| 1100 | 12 [V/16] |
| 1101 | 13 [V/16] |
| 1110 | 14 [V/16] |
| 1111 | 15 [V/16] |

Thus, with the additional resistor, when the N=4 bit digital word $I_4I_3I_2I_1$ changes (i.e., increases or decreases) by one least significant bit, the output voltage, $V_0$, at terminal 11 changes (i.e., increases or decreases) an LSB step (i.e., changes $V/[2^N]=V/16$).

Figure 7:
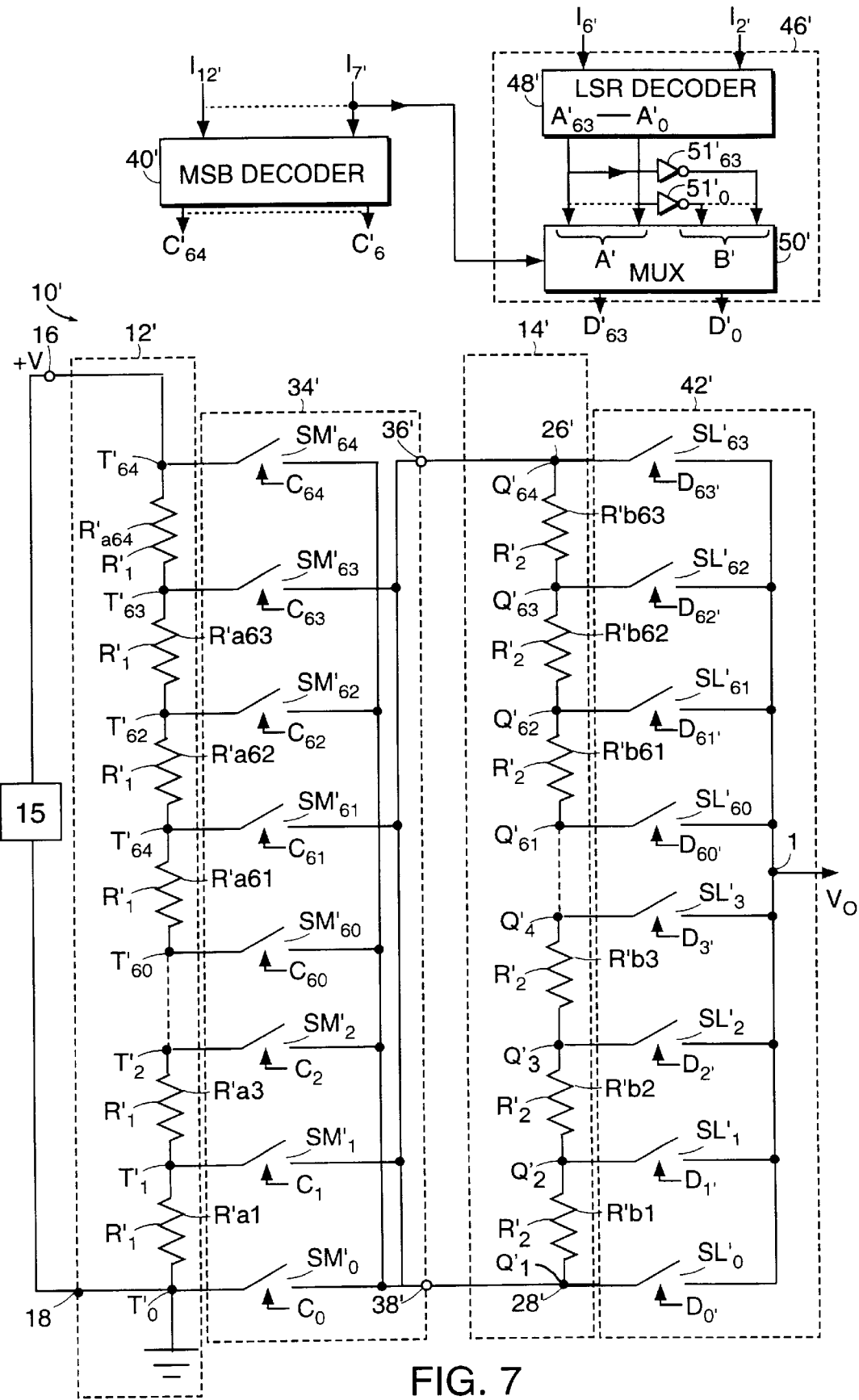
FIG. 7 is a schematic diagram of a twelve bit digital to analog converter (DAC) according to the invention.

Referring now to FIG. 7, an N=12 bit DAC 10' is shown to adapted to convert a twelve bit digital word, $I'_{12}I'_{11} \ldots I'_2I'_1$, (where bit $I'_1$ is the least significant bit (LSB) and $I'_{12}$ is the most significant bit (MSB)) into a corresponding analog signal, $V_o'$, at output terminal 11'. The DAC 10' includes a pair of resistor strings 12', 14'. Resistor string 12' is adapted for coupling across a voltage supply 15. The voltage supply 15 produces a voltage, +V, at terminal 16 relative to ground potential at terminal 18. The first resistor string 12' has a plurality of, here $2^{N/2}$, i.e., 64 resistors R'a1–R'a[$2^{N/2}$], (i.e., R'a1–R'a64 serially connected between terminals 16 and 18, as shown. The resistance of each one of the resistors R'a1–R'a64 is here R'$_1$ ohms. It is noted that resistors Ra'1 ... R'a64 have: resistor Ra'1 terminals T'$_0$, T'$_1$; ... and resistor R'a64 terminals T'$_{63}$ and T'$_{64}$, respectively, as shown. Resistor R'al terminal T'$_0$ is connected to terminal 18 and resistor R'a64 terminal T'$_{64}$ is connected to terminal 16, as shown. The resistors R'1–R'64 in the resistor string 12' produce voltages in response to current fed thereto from the voltage supply 15.

The second resistor string 14' has a plurality of, only $2^{N/2}-1$, here 63 resistors R'b1, R'b2, ... R'b63 of substantially equal resistance, here a resistance of R'$_2$ ohms, serially coupled between a pair of second resistor string 14' input terminals 26', 28', as shown. Further, it is again noted that if the number of bits of the digital word being converted is N, the number of resistors in the first resistor string 14' is $2^{N/2}$ and the number of resistors in the second resistor string 14' is $2^{N/2}-1$.

Resistors R'b1, ... R'b63 have: resistor R'b1 terminals Q'$_1$, Q'$_2$ ... resistor R'b63 terminals Q'$_{63}$, Q'$_{64}$, respectively, as shown.

A first switching network 34' has a pair of switch output terminals 36', 38' connected to the second resistor string 14' input terminals 26', 28', respectively, as shown. The first switching network 34' includes a plurality of, here $2^{N/2}+1$ (i.e., sixty-five) switches SM'$_0$, SM'$_1$, SM'$_2$, SM'$_3$ ... and SM'$_{64}$. The inputs of switches SM'$_0$, SM'$_1$, SM'$_2$, ... SM'$_{63}$ and SM'$_{64}$ are connected to terminals T'$_0$, T'$_1$, T'$_2$, T'$_3$ ... and T'$_{64}$, respectively, as shown. The outputs of switches SM'$_0$, SM'$_2$, ... and SM'$_{64}$ are connected switch output terminal 38', as shown. The outputs of switches SM'$_1$, SM'$_3$, ... SM'$_{63}$ are connected to switch output terminal 36', as shown. The "on" (i.e., closed)/"off" (i.e., open) condition of the switches SM'$_0$, SM'$_1$, SM'$_2$, SM'$_3$, ... and SM'$_{64}$ is controlled by binary (i.e., logic) signals on control lines C'$_0$, C'$_1$, C'$_2$, C'$_3$, ... and C'$_{64}$, respectively, as indicated. The binary signals on control lines C'$_0$, C'$_1$, C'$_2$, C'$_3$ ... and C'$_{64}$, are produced by a Most Significant Bit (MSB) decoder section 40'. The MSB decoder section 40' produces the binary signals on control lines C'$_0$–C'$_{64}$ in response to the N/2 (i.e., six) most significant bits, I'$_{12}$ ... I'$_7$ of the twelve bit digital word I'$_{12}$ ... I'$_1$ being converted in an analog signal by DAC 10'. The relationship between the bits on lines I'$_{12}$ ... I'$_7$ and the open/closed condition of the switches SM'$_0$, SM'$_1$, SM'$_2$, SM'$_3$, ... SM'$_{64}$ is shown in FIG. 8. The MSB decoder 40' here uses Gray code decoding. That is, the digital data on bit lines I'$_{12}$–I'$_7$ is Gray encoded to reduce the decoder implementation.

A second switching network 42' has an output terminal 11' which provides the output, $V_o$, for the DAC 10' (i.e., the converted analog signal). The second switching network 42' includes a plurality of, here $2^{N/2}$ (i.e., sixty-four), switches SL'$_0$, SL'$_1$, SL'$_2$, ... SL'$_{62}$ and SL'$_{63}$. The inputs of switches SL'$_0$, SL'$_1$, SL'$_2$, ... SL'$_{62}$ and SL'$_{63}$ are connected to terminals Q'$_1$, Q'$_2$, Q'$_3$, ... Q'$_{63}$ and Q'$_{64}$, respectively, as shown. The outputs of switches SL'$_0$, SL'$_1$, ... and SL'$_{63}$ are connected to DAC 10' output terminal 11', as shown. The "on" (i.e., closed)/"off" (i.e., open) condition of the switches SL'$_0$, SL'$_1$, SL'$_2$, ... and SL'$_{63}$ is controlled by binary (i.e., logic) signals on control lines D'$_0$, D'$_1$, D'$_2$, ... and D'$_{63}$, respectively, as indicated. The binary signals on control lines D'$_0$, D'$_1$, D'$_2$, ... and D'$_{63}$, are produced by a Least Significant Bit (LSB) decoder section 46'. The LSB decoder section 46' includes an LSB decoder 48' and a multiplexer 50'. The LSB decoder section 46' is fed by the N/2 (i.e., six) least significant bits I'$_6$ ... I'$_1$ of the digital word being converted by the DAC 10' and the next highest order bit, i.e., [N/2]+1 bit I'$_7$ of such digital word.

More particularly, the LSB decoder 48' is fed by the six least significant bits I'$_6$ ... I'$_1$ and, in response to such bits, produces binary signals at output terminals A'$_0$, A'$_1$, A'$_3$, ... and A'$_{63}$. The output terminals A'$_0$, A'$_1$, A'$_2$, ... and A'$_{63}$ are connected to two sets of inputs to the multiplexer 50' (i.e., set of inputs A' and set of inputs B'). The multiplexer 50' has output terminals D'$_0$, D'$_1$, D'$_2$, . . . and D'$_{63}$. In response to the binary signal; of bit I'$_7$ one of the two input sets A' or B' is selectively coupled to the output terminals D'$_0$, D'$_1$, D'$_2$, . . . and D'$_{63}$. More particularly, when the binary signal of bit I'$_7$ is logic 0, the output terminals A'$_0$, A'$_1$, A'$_2$, . . . and A'$_{63}$ become coupled to output terminals D'$_0$, D'$_1$, D'$_2$ and . . . D'$_{63}$, respectively, in a manner similar to that discussed in connection with FIG. 1 for DAC 10. When the binary signal of bit I'$_7$ is logic 1, the output terminals A'$_{63}$, . . . , A'$_2$, A'$_1$ and A'$_0$ become coupled to output terminals D'$_{63}$, D'$_{62}$, D'$_{61}$, . . . and D'$_0$, respectively, after passing through inverters 51'$_{63}$, . . . 51'$_0$, respectively, as shown, in a manner similar to that discussed in connection with DAC 10 in FIG. 1. Thus, the LSB decoder section 46' produces the binary signals on control lines D'$_0$–D'$_{63}$ in response to the seven least significant bits, I'$_7$, I'$_6$, . . . I'$_1$ of the twelve bit digital word I'$_{12}$ . . . I'$_3$I'$_2$I'$_1$ being converted in an analog signal by DAC 10'. The relationship between the bits on lines I'$_{12}$ . . . I'$_2$I'$_1$ and the open/closed condition of the switches SL'$_0$, SL'$_1$, SL'$_2$, . . . SL'$_{63}$ is shown in FIG. 9. (It is noted that only one of the switches SL'$_0$–SL'$_{63}$ is closed for a digital word fed to the DAC 10'.

It is first noted that the first switching network 34' is adapted to couple terminals of a selected one of the resistors R'a1–R'a64 in the first resistor string 12' to the pair of switch output terminals 36', 38'. The resistors R'b1–R'b63 in the second resistor 14' string produce voltages at the terminals Q'$_1$–Q'$_{64}$ in response to current passing between the first resistor string 12' and the second resistor string 14' through the first switching network 34'. The second switching network 42' is adapted to couple a selected one of the voltages produced at a resistor terminal Q'$_1$–Q'$_{64}$ of a selected one of the resistors R'b1–R'b63 in the second resistor string 14' to the output terminal 11' of the converter 10'.

The operation of the DAC 10' is thus similar to DAC 10 described above in connection FIG. 1. Here, the resistance, r'$_p$ across a pair of successive terminals T'$_0$–T'$_{64}$ (e.g., the resistance between terminals T'$_2$, T'$_3$) is: R'$_p$=R'$_1$[63R'$_2$]/ [R'$_1$+63R'$_2$]; assuming that the "on" resistance of each of the switches SM'$_0$–SM'$_{64}$ is zero. It R'$_1$=R'$_2$, r$_p$=63R'$_1$/64. Thus, a little thought will make it apparent as the digital word I'$_{12}$ . . . I'$_1$ changes (i.e., increases or decreases) by one least significant bit, the output voltage V$_o$ at terminal 11' will change (i.e., increase or decrease) one LSB (i.e., the output voltage V$_o$ changes by V/[2$^N$-1]=V/4095). Further, with an additional resistor connected serially between terminal 16 and terminal T$_{64}$ of R'$_1$/2$^{N/2}$ ohms=R'$_1$/64 ohms, as the digital word I'$_{12}$ . . . I'$_1$ changes (i.e., increases or decrease) by one least significant bit, the output voltage V$_o$ at terminal 11' will change (i.e., increase or decrease) one LSB (i.e., the output changes V/[2$^N$]=V/4096).

Figure 10:
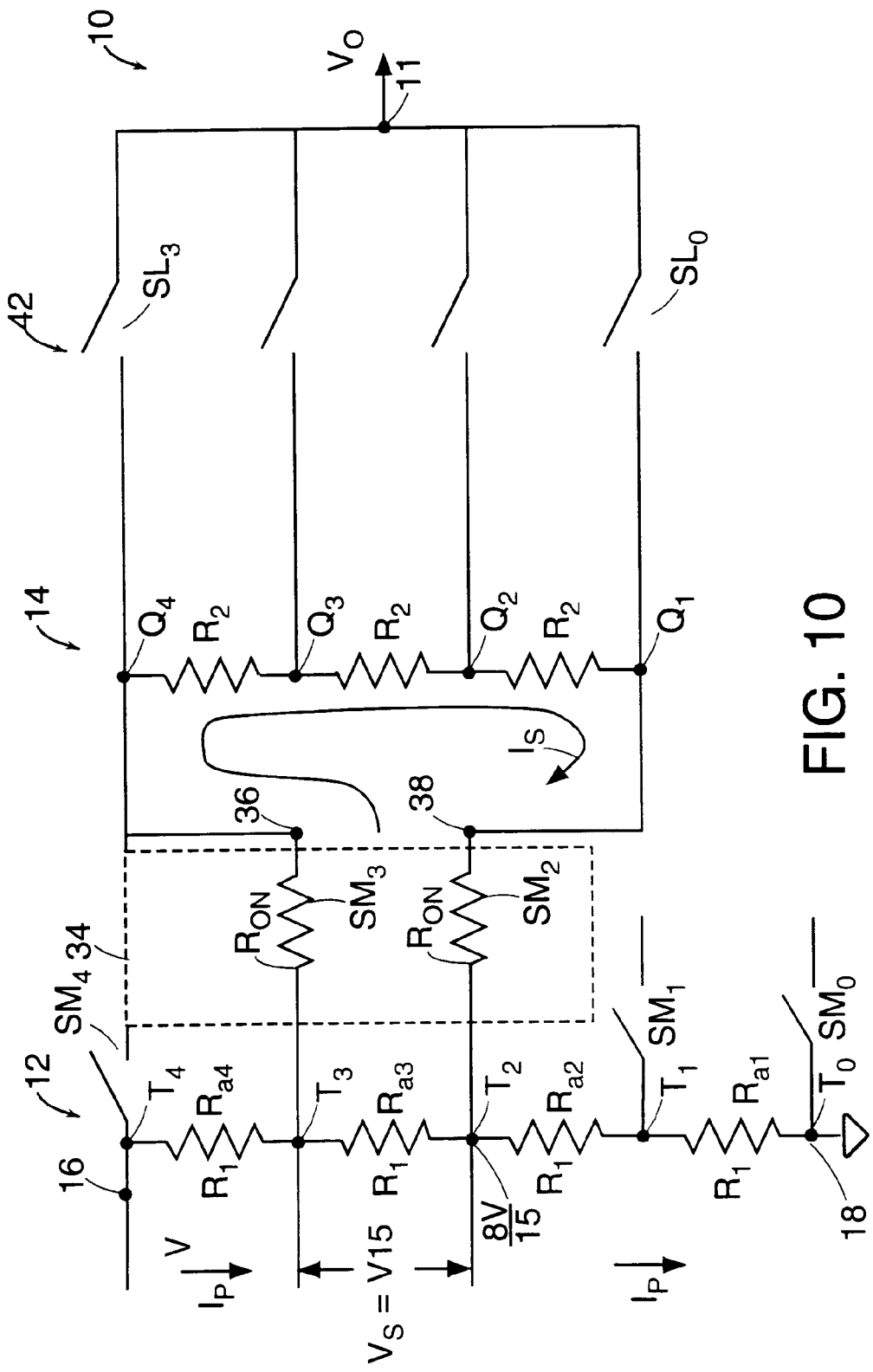
FIG. 10 is a schematic diagram of the DAC of FIG. 1 when the most significant bits of the digital word fed thereto is 10 as in FIG. 5 and showing the effect of non-zero resistance of switches when such switches are in a closed (i.e., conducting condition)

Referring now to FIG. 10, the effect of a non-zero resistance for the switches SM$_0$–SM$_4$ of the DAC 10 shown in FIG. 1 will be discussed. Here, the switches SM$_0$–SM$_4$ are CMOS switches each having an "on",or conducting resistance of R$_{ON}$. Thus, consider the example where switched SM$_2$ and SM$_3$ are "on" (i.e., conducting), and all other switches SM$_0$, SM$_1$, SM$_4$ are "off" (i.e., non-conducting). When the second resistor string 14' is connected in parallel with a selected one of the resistors Ra1 to Ra2$^{N/2}$, where here N=4, here in this example across resistor Ra3, the effective resistance across the terminals T$_2$, T$_3$ of the selected one of the resistors Ra3 is R$_1$ [(2$^{N/2}$-1) R$_2$+2R$_{ON}$]/ (R$_1$+(2$^{N/2}$-1)R$_2$+2R$_{ON}$) By selecting R$_2$=R$_1$+2R$_{ON}$ a step change of substantially one LSB is produced at the DAC 10 output 11, when a one bit change is made in the least significant bit of a digital word I$_N$I$_{N-1}$ . . . I$_1$ being converted by the DAC 10. Also, a one LSB voltage step is experienced at a terminal 36, 38 when the first switching network 34 switches from coupling one of the first resistors in section 14 to the pair of output terminals 36, 38 to coupling the next successively serially coupled one of the resistors in network 12 to the pair of output terminals 36, 38. That is, if, for example, the first switching network 34 has selected resistor Ra2 and then switches to select resistor Ra3, the voltage at terminal 38 changes by substantially one LSB at the DAC 10 output 11, if the relationship between R$_1$, R$_2$, and R$_{ON}$ is, then R$_2$=R$_1$+2R$_{ON}$.

Figure 11:
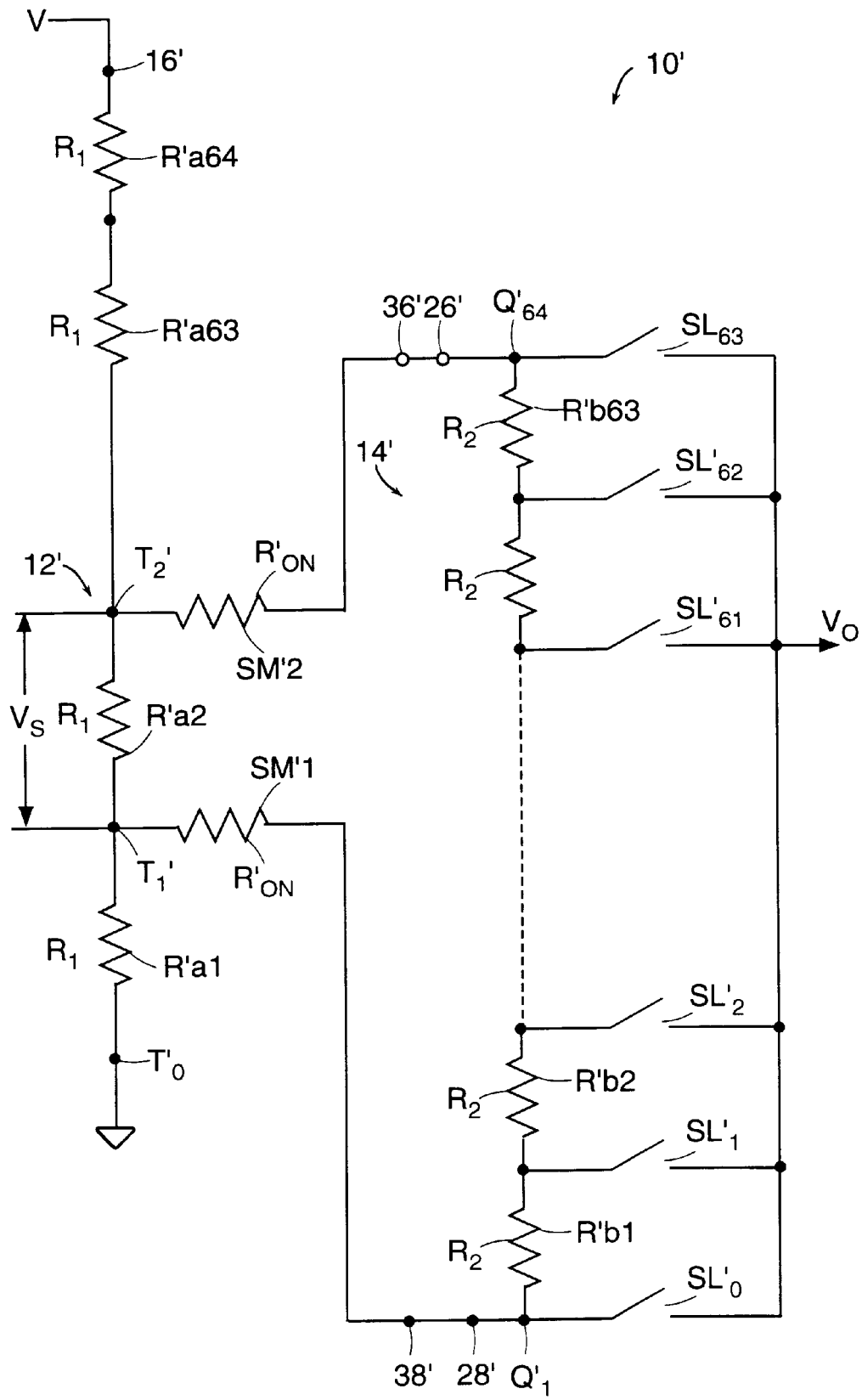
FIG. 11 is a schematic diagram of the DAC of FIG. 7 when the six most significant bits of the digital word fed thereto are 000001 and showing the effect of non-zero resistance of switches when such switches are in a closed (i.e., conducting condition).

Referring now to the effect of a non-zero resistance for the switches SM'$_0$–SM'$_{64}$ of the DAC 10' shown in FIG. 11 will be discussed. Here, the switches SM'$_0$–SM'$_{64}$ are CMOS switches each having an "on",or conducting resistance of R'$_{ON}$. Thus, considering the example where switched SM'$_1$ and SM'$_2$ are "on" (i.e., conducting), and all other switches SM'$_0$, SM'$_3$, . . . SM'$_{64}$ are "off" (i.e., non-conducting), if the relationship between R'$_1$, R'$_2$. and R'$_{ON}$ is, then R'$_2$=R'$_1$+ 2R'$_{ON}$. When the second resistor string 14' is connected in parallel with a selected one of the resistors Ra1 to Ra2$^{N/2}$, the effective resistance across the terminals T'$_2$, T'$_3$ of the selected one of the resistors R'a3 is R'$_1$ [(2$^{N/2}$-1)R'$_2$+2R'$_{ON}$]/ (R'$_1$+(2$^{N/2}$-1)R'$_2$+2R'$_{ON}$). By selecting R'$_2$=R'$_1$+2R'$_{ON}$ a step change of substantially one LSB is produced at the DAC 10' output 11', when a one bit change is made in the least significant bit of a digital word I'$_N$I'$_{N-1}$ . . . I'$_1$ being converted by the DAC 10'. Also, a voltage step of less than one LSB is experienced at a terminal T'$_1$–T'$_{63}$ when the first switching network 34' switches from coupling one of the first resistors in section 14' to the pair of output terminals 36', 38' to coupling the next successively serially coupled one of the resistors in network 12' to the pair of output terminals 36', 38'. That is, if, for example, the first switching network 34' (FIG. 7) has selected resistor R'a2 and then switches to select resistor R'a3, the voltage at terminal T'$_2$ changes by substantially (i.e., a little less than) one LSB at the DAC 10' output 11', if the relationship between R'$_1$, R'$_2$, and R'$_{ON}$ is, then R'$_2$=R'$_1$+2R'$_{ON}$.

Other embodiments are within the spirit and scope of the appended claims. For example, due to manufacturing variances and second order non-ideal conditions, the nominal values of R'$_1$, R'$_2$, and R'$_{ON}$ may be adjusted to give optimum results. Monte Carlo analysis or other statistical analysis may be used to perform this optimization. Further, various technologies may be used for the switches, such as CMOS transmission gates, one MOS transistor type (e.g., NMOS or PMOS), either of the above with a single, or plurality of, series resistors on one or both sides of the switch. Still further, two parallel resistor strings may be used.

What is claimed is:

1. An digital to analog converter, comprising:
 a pair of resistor strings, a first one of the resistor strings being adapted for coupling across a voltage supply, resistors in the first resistor string producing voltages in response to current fed thereto from the voltage supply and a second one of the resistor strings comprising only 2n+1 resistors where n is a positive integer, each resistor in the second string having a pair of terminals;
 a first switching network adapted to couple a voltage produced across a selected one of resistors in the first string across the second one of the resistor strings, the resistors in the second resistor string producing voltages in response to current passing from the first resistor string to the second resistor string through the first switching network;

a second switching network comprising a plurality of 2n+2 switches, each one of the switches having an input connected to one of the terminals the resistors in the second string of resistors and an output connected to a common output, such second switching network being adapted to couple a selected one of the voltages produced by a selected one of the resistors in the second resistor string to the common output;

wherein the resistance across the second resistor string is larger than the resistance of the selected one of the resistors in the first resistor string.

2. The digital to analog converter recited in claim 1 wherein the first switching network is responsive to the most significant bits (MSBs) of the digital word and the second switching network is fed by the least significant bits (LSBs) of the digital word.

3. A digital to analog converter for converting a digital word into a corresponding analog signal, comprising:

a plurality of first resistors serially coupled between a pair of reference voltage terminals for producing voltages in response to current from a voltage supply coupled between the pair of reference voltage terminals, each one of the first plurality of resistors having a resistance R;

a plurality of only 2n+1 second resistors, where n is a positive integer, serially connected between a pair of input terminals, each one of the second plurality of resistors having the same resistance, such second plurality of resistors providing a resistance MR across the pair of input terminals where M is greater than 1;

a first switching network having a plurality of switches fed by bits of the digital word and arranged to couple a voltage produced across one of the first plurality of resistors to the pair of input terminals and enable a portion of the current from the voltage supply to pass through the plurality of second resistors to produce voltages in response to such portion of the current, the one of first plurality of resistors being selected in accordance with bits of the digital word;

a second switching network, comprising a plurality of 2n+2 switches, each one of thereof having an input connected to a terminal of one of the resistors in the second string of resistors and an output, the outputs of the switches being connected to a common output, such second switching network being adapted to couple the voltage produced at one of the second plurality of resistors to the common output to provide the corresponding analog signal, such one of the second plurality of resistors being selected in accordance with bits of the digital word.

4. A digital to analog converter for converting a digital word into a corresponding analog signal, comprising:

a plurality of first resistors serially coupled between a pair of reference voltage terminals for producing voltages in response to current from a voltage supply coupled between the pair of reference voltage terminals;

a plurality of second resistors serially connected between a pair of input terminals, such second string of resistors comprising only 2n+1 resistors where n is a positive integer;

a first switching network for coupling a voltage produced across one of the first plurality of resistors to the pair of input terminals and enabling a portion of the current from the voltage supply to pass through the plurality of second resistors to produce voltages in response to such portion of the current, the one of first plurality of resistors being selected in accordance with bits of the digital word;

a second switching network, comprising a plurality of 2n+2 switches each one having an input connected to a terminal of one of the resistors in the second string of resistor and an output terminal, the output terminal being connected to a common output, such second switching network being adapted to couple the voltage produced at one of the second plurality of resistors to the common output to provide the corresponding analog signal, such one of the second plurality of resistors being selected in accordance with bits of the digital word.

5. A digital to analog converter for converting a digital word into a corresponding analog signal, comprising:

a first resistor string comprising a plurality of resistors serially coupled between a pair of reference voltage terminals, such resistors producing voltages in response to current from a voltage supply coupled between the pair of reference voltage terminals;

a second resistor string comprising a plurality of only 2n+1 resistors, where n is a positive integer, serially connected between a pair of input terminals;

a first switching network for coupling a voltage produced across one of the resistors in the first resistor string selected in accordance with bits of the digital word to the pair of input terminals and enabling a portion of the current from the voltage supply to pass through the second resistor string, the plurality of resistors in the second resistor string producing voltages in response to the portion of the current fed to the second resistor string;

a second switching network comprising a plurality of 2n+2 switches, each one of the switches having an input connected to one terminal of a resistor in the second string of resistors and an output, the output of the plurality of switches being connected to a common output, such second switching network being adapted to couple the voltage produced at a selected of the resistors in the second resistor string to the common output to provide the corresponding analog signal, such one of the resistors in the second resistor string being selected in accordance with bits of the digital word.

6. A digital to analog converter adapted to convert an N bit digital word into a corresponding analog signal at an output of the converter, such converter comprising:

a pair of resistor strings, a first one of the resistor strings being adapted for coupling across a voltage supply, such resistor string having $2^{N/2}$ resistors, the resistors in the first resistor string producing voltages in response to current fed thereto from the voltage supply, a second one of the resistor strings having a plurality of, only $2^{N/2}-1$, resistors of substantially equal resistance serially coupled between a pair of second resistor string input terminals;

a first switching network having a pair of switch output terminals connected to input terminals of the second resistor string, the first switching network being adapted to couple terminals of a selected one of the resistors in the first resistor string to the pair of switch output terminals, the resistors in the second resistor string producing voltages in response to current passing between the first resistor string and the second resistor string through the first switching network; and a second switching network adapted to couple a selected one of the voltages produced at a terminal of a selected one of the resistors in the second resistor string to the output of the converter.

7. The digital to analog converter recited in claim 6 wherein the resistance across the second resistor string is larger than the resistance of the selected one of the resistors in the first resistor string.

8. The digital to analog converter recited in claim 7 wherein the resistances of the second mentioned string and resistance of the first switching network, are selected to produce a step change in output signal corresponding to substantially a change of one least significant bit in the digital word fed to the digital to analog converter.

9. The digital to analog converter recited in claim 8 wherein the resistances of the second resistor string and resistance conducting switches in the first switching network are selected to produce a step change of substantially one LSB at the digital to analog converter output, where LSB is the least significant bit of the digital word converted by the converter, when the first switching network switches from coupling a first one of the selected resistor in the first resistor string to the pair of first switching network output terminals to coupling a second one of the resistor in the first resistor string successively serially coupled to the selected first one of the resistors in the first switching network to the first switching network output terminals.

* * * * *